United States Patent
Abe

(10) Patent No.: US 6,436,729 B1
(45) Date of Patent: Aug. 20, 2002

(54) PROCESS FOR PRODUCING SOLID IMAGE PICKUP DEVICE AND SOLID IMAGE PICKUP DEVICE

(75) Inventor: Hideshi Abe, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/624,148

(22) Filed: Jul. 21, 2000

(30) Foreign Application Priority Data

Jul. 23, 1999 (JP) .......................................... 11-208847

(51) Int. Cl.$^7$ ............................................... H01L 21/00
(52) U.S. Cl. ............................. 438/60; 438/48; 438/69; 438/75; 437/53; 257/231; 257/232; 257/241
(58) Field of Search .............................. 438/60, 69, 48, 438/75; 257/231, 232, 241; 437/53

(56) References Cited

U.S. PATENT DOCUMENTS

| | | | |
|---|---|---|---|
| 5,565,373 A | * 10/1996 | Nakashiba | .................. 437/53 |
| 6,143,585 A | * 11/2000 | Hatano et al. | ................. 438/69 |
| 6,194,242 B1 | * 2/2001 | Uchiya | ........................ 438/48 |
| 6,255,640 B1 | * 7/2001 | Endo et al. | ............... 250/208.1 |

* cited by examiner

*Primary Examiner*—Son T. Dinh
*Assistant Examiner*—Pho Luy
(74) *Attorney, Agent, or Firm*—Rader, Fishman & Grauer PLLC; Ronald P. Kananen, Esq.

(57) ABSTRACT

A process for producing a solid image pickup device is demanded that can enhance a photoelectric conversion region by forming an overflow barrier layer at a deep position and can prevents generation of radiation due to the use of resist as a mask. Upon producing a solid image pickup device having a vertical overflow drain structure, ion implantation is conducted on an entire of a silicon substrate without using a resist mask, so as to form an overflow barrier layer. It is also possible that a trench is formed in a peripheral part of the silicon substrate to surround a pixel region and to separate the overflow barrier layer into the pixel region and an outer peripheral part, and an impurity diffusion layer having a conductive type different from that of the overflow barrier layer is formed on an inner surface of the trench.

13 Claims, 3 Drawing Sheets

PROCESS FOR PRODUCING SOLID IMAGE PICKUP DEVICE AND SOLID IMAGE PICKUP DEVICE

FIELD OF THE INVENTION

The present invention relates to a solid image pickup device having a vertical overflow drain structure and a process for producing the same.

BACKGROUND OF THE INVENTION

As an example of a CCD type solid image pickup device (hereinafter referred to as a solid image pickup device), one having a vertical overflow drain structure shown in FIG. 7 has been known.

In the solid image pickup device, light accepting sensor parts 2 of an island form conducting photoelectric conversion are arranged in a matrix form on a surface part of an N type silicon (Si) substrate 1. Vertical transfer parts 3 of a line form are formed on one side of a row of the light accepting sensor parts 2, and image separating regions 4 are formed on the other side of the row.

Transfer electrodes 5 of a line form are formed on a surface of the silicon substrate 1 at a position directly above the vertical transfer parts 3 via a silicon oxide film (not shown in the figure).

Outside a pixel region G having the light accepting sensor parts 2, the vertical transfer parts 3 and the image separating regions 4 formed therein, a $P^+$ layer 6 is formed, and an N+ diffusion layer 7 is formed further outside the $P^+$ layer 6. A 2P well 8 is formed under the vertical transfer parts 3 in the silicon substrate 1, and an overflow barrier layer 9 is formed under the 2P well 8 and the light accepting sensor parts 2 throughout the entire pixel region G but not reaching a peripheral part of the silicon substrate 1.

In the solid image pickup device having such a structure, light incident on the light accepting sensor part 2 is subjected to photoelectric conversion and accumulated as electrons in the light accepting sensor part 2. When the electrons are accumulated to a certain amount, excess electrons are drained over the overflow barrier layer 9 to the silicon substrate 1. The structure draining the excess electrons is called as the vertical overflow drain structure.

The potential of the overflow barrier layer 9 is generally controlled by the potential of the silicon substrate 1. Therefore, the so-called electronic shutter operation can be realized by the structure, in which a high voltage is applied to the silicon substrate 1 to break peaks of the potential of the overflow barrier layer 9, whereby the charge contained in the light accepting sensor part 2 is completely drained to the silicon substrate 1.

The voltage for the silicon substrate 1 is generally applied from the $N^+$ diffusion layer 7 formed outside the pixel region G. The overflow barrier layer 9 is electrically connected to the image separating region 4 and the 2P well 8 of the pixel region G and is at a potential that approaches from the ground level to the potential of the silicon substrate 1 by a few volts. It is also electrically connected to the $P^+$ layer 6 (ground level) formed in the vicinity of the pixel region G, and thus the entire pixel region G is effectively surrounded by a p well. In order that the potential of the silicon substrate 1 does not directly affect the pixel region G on conducting the electronic shutter operation, the $N^+$ diffusion layer 7 is formed in the outermost peripheral region to ensure the substrate potential.

Because the overflow barrier layer 9 determines the depth of the region of the light accepting sensor part 2 conducting photoelectric conversion, the deeper the position of the overflow barrier layer 9 is, the larger the photoelectric conversion region is, and the higher the sensitivity is.

In the conventional solid image pickup device, the overflow barrier layer 9 is formed by ion implantation of boron (B), and the ion implantation is conducted by using a resist mask having openings at the positions corresponding to the pixel region G. Therefore, in order to make deeper the position of the overflow barrier layer 9 to improve the sensitivity with maintaining the conventional constitution, it is necessary that the implantation energy is sufficiently high, and the thickness of the resist as a mask upon ion implantation is also sufficiently large as corresponding to the high implantation energy. Specifically, the thickness of the resist mask is necessarily 1.5 times the depth of the overflow-barrier layer 9 formed, i.e., the distance corresponding to the projection range (Rp) of the ion implantation.

In the case where a mask made of resist is formed, openings are formed at the positions where the overflow barrier layer 9 is formed, i.e., the positions corresponding to the pixel region G. However, when the thickness of the resist is increased because of the reason described in the foregoing, the following problems occur.

In general, when a resist film having a large thickness is exposed, an amount of gas formed from the interior of the film is increased, and also the exposure time is increased. Thus, the resist film may be foamed because of a bumping of the reaction gas inside the resist film. When foaming of the resist film occurs, holes are formed at the foamed positions, and thus the desired mask performance cannot be obtained.

Furthermore, in order to coat resist to a large thickness, it is necessary that the resist is prepared to have a high viscosity, and the resist is coated by spin coating at a relatively low rate. In such a case, it is liable to cause unevenness in thickness in a radial pattern when coating, and therefore it is difficult to coat the resist to a large thickness.

Moreover, when ion implantation is conducted at a high implantation energy, for example, of from 6 to 7 MeV or higher, to form the overflow barrier layer 9 at the deeper position, a boron (B) atom to be implanted and a hydrogen atom constituting the resist collide with each other over the coulomb barriers of the atomic nuclei thereof to increase the probability of a nuclear reaction and to cause a problem of generation of radiation. The nuclear reaction is liable to occur with the largest probability at the time when the implanted ion is finally stopped by losing its energy by collision with the surrounding substances, i.e., at the time immediately before the ion is stopped.

Therefore, when the implantation energy is increased, it becomes difficult to use resist as the mask.

SUMMARY OF THE INVENTION

The invention has been developed in view of the problems associated with the conventional techniques, and an object thereof is to provide a process for producing a solid image pickup device and a solid image pickup device in that an overflow barrier layer can be formed at a deep position to enhance a photoelectric conversion region, and the generation of radiation due to the use of resist as a mask can be prevented.

The invention relates to, as a first aspect, a process for producing a solid image pickup device having a vertical overflow drain structure, in which ion implantation is conducted for an entire of a silicon substrate without using a resist mask, preferably at a high implantation energy, so as to form an overflow barrier layer.

According to the production process of the first aspect of the invention, the overflow barrier layer can be formed as a deep position by conducting the ion implantation with a high implantation energy, and the generation of radiation can be surely prevented by conducting the ion implantation without using a resist mask.

The invention also relates to, as a second aspect, a solid image pickup device having a vertical overflow drain structure, in which an overflow barrier layer is formed over an entire on a silicon substrate, a trench is formed in a peripheral part of the silicon substrate to surround a pixel region and to separate the overflow barrier layer into the pixel region and an outer peripheral part, and an impurity diffusion layer having a conductive type different from that of the overflow barrier layer is formed on an inner wall of the trench.

According to the solid image pickup device of the second aspect of the invention, the overflow barrier layer is electrically separated into the pixel region and the outer peripheral part thereof by the impurity diffusion layer because the trench is formed in the peripheral part of the silicon substrate to surround a pixel region and to separate the overflow barrier layer into the pixel region and the outer peripheral part, and the impurity diffusion layer having a conductive type different from that of the overflow barrier layer is formed on the inner wall of the trench. Therefore, the junction of the silicon substrate and the overflow barrier layer is exposed on the side surface of the silicon substrate, and the generation of a leakage electric current at that position is prevented.

The invention also relates to, as a third aspect, a process for producing a solid image pickup device having a vertical overflow drain structure, the process comprising a step of conducting ion implantation on an entire of a silicon substrate preferably with a high implantation energy to form an overflow barrier layer, a step of forming a trench in a peripheral part of the silicon substrate to surround a pixel region and to separate the overflow barrier layer into the pixel region and an outer peripheral part, and a step of forming an impurity diffusion layer having a conductive type different from that of the overflow barrier layer on an inner wall of the trench.

According to the production process of the third aspect of the invention, the overflow barrier layer can be electrically separated into the pixel region and the outer peripheral part thereof by the impurity diffusion layer by forming the trench in the peripheral part of the silicon substrate to surround a pixel region and to separate the overflow barrier layer into the pixel region and the outer peripheral part, and by forming the impurity diffusion layer having a conductive type different from that of the overflow barrier layer on the inner wall of the trench. Therefore, the junction of the silicon substrate and the overflow barrier layer is exposed on the side surface of the silicon substrate, and the generation of a leakage electric current at that position is prevented.

Furthermore, when the overflow barrier layer is formed by conducting ion implantation without using a resist mask, the problems associated with conducting the ion implantation at a high energy can be avoided, so as to form the overflow barrier layer at a deep position.

DESCRIPTION OF PREFERRED EMBODIMENTS

Preferred embodiments of the invention will be described in detail below with reference to the drawings.

Figure 1:
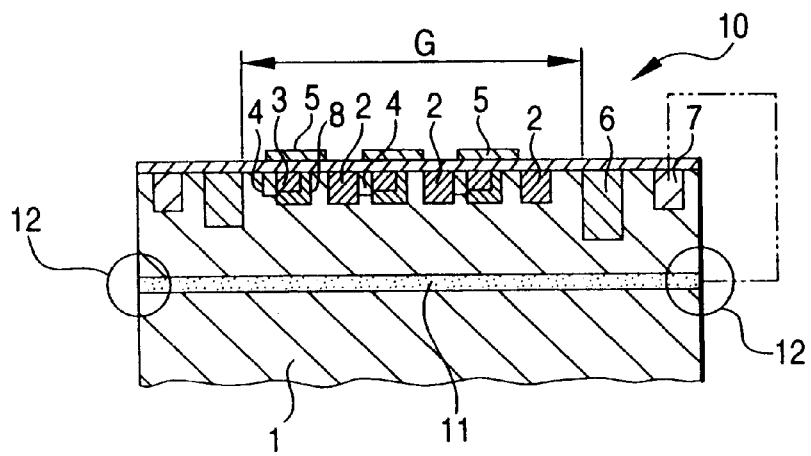
FIG. 1 is a cross sectional view of an important part showing one embodiment of the process for producing a solid image pickup device according to the first aspect of the invention.
Figure 7:
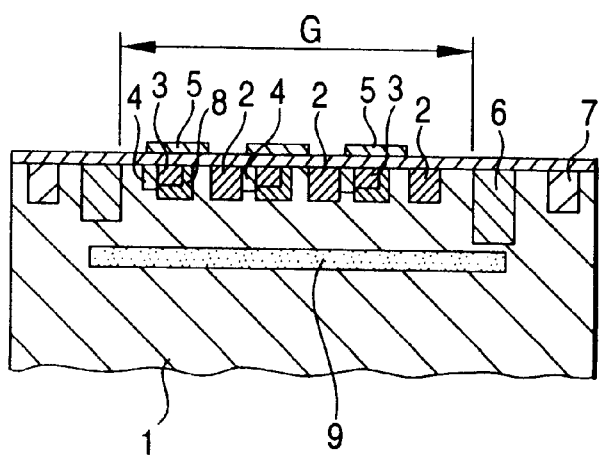
FIG. 7 is a cross sectional view of an important part showing an example of a conventional solid image pickup device.

FIG. 1 is a cross sectional view of an important part showing one embodiment of the process for producing a solid image pickup device according to the first aspect of the invention, in which numeral 10 denotes a solid image pickup device. The solid image pickup device 10 is different from the conventional solid image pickup device shown in FIG. 7 in the following points. An overflow barrier layer 11 is formed throughout the entire of a silicon substrate 1 and is formed in the silicon substrate 1 at a position deeper than the case of the conventional one shown in FIG. 7.

Figure 2:
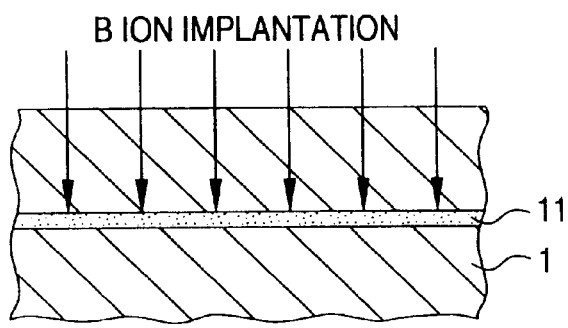
FIG. 2 is a cross sectional view of an important part showing a method for forming an overflow barrier layer.

Upon producing the solid image pickup device 10 having such a constitution, the overflow barrier layer is formed in such a manner that boron (B) is ion-implanted at a high implantation energy directly to the silicon substrate 1 as shown in FIG. 2, so as to form the overflow barrier layer 11 at the position of a depth of about 10 µm from the surface of the silicon substrate 1, which is different from the conventional process using a resist mask having an opening at a position corresponding to a pixel region G. The implantation energy is preferably as high as possible to form the overflow barrier layer 11 at a deeper position and is desirably a super high energy of from 6 to 7 MeV.

Other constitutional components of the solid image pickup device 10 can generally be formed in the conventional manner after the formation of the overflow barrier layer 11.

In the production process, because the ion implantation is conducted using no resist mask, the ion implantation can be conducted with a high implantation energy, and thus the overflow barrier layer 11 can be formed at a deep position to obtain a wide photoelectric conversion region. Furthermore, owing to the ion implantation conducted without a resist mask, generation of radiation can be surely prevented even when the ion implantation is conducted at a super high energy of from 6 to 7 MeV, which causes a problem of generation of radiation with using a resist mask. That is, because the silicon substrate 1 contains substantially no hydrogen atom causing a nuclear reaction, generation of radiation due to the nuclear reaction can be surely prevented by setting the projection range (Rp) of the ion implantation at the interior of the silicon substrate 1.

In the solid image pickup device 10 having such a constitution, a junction part 12 of the P type overflow barrier layer 11 and the N type silicon substrate 1 is exposed on the side surface of the solid image pickup device 10. Therefore, even when the voltage for the silicon substrate 1 is taken from the back surface of the silicon substrate 1 but not from the upper surface of the silicon substrate 1, a leakage electric current is caused at the junction part 12. In order to prevent generation of the leakage electric current in the solid image pickup device 10, it is necessary that an $N^+$ diffusion layer 7 and the overflow barrier layer 11 are electrically connected as shown by the double dotted line in FIG. 1 outside a package (not shown in the figure) covering the solid image pickup device 10.

Figure 3:
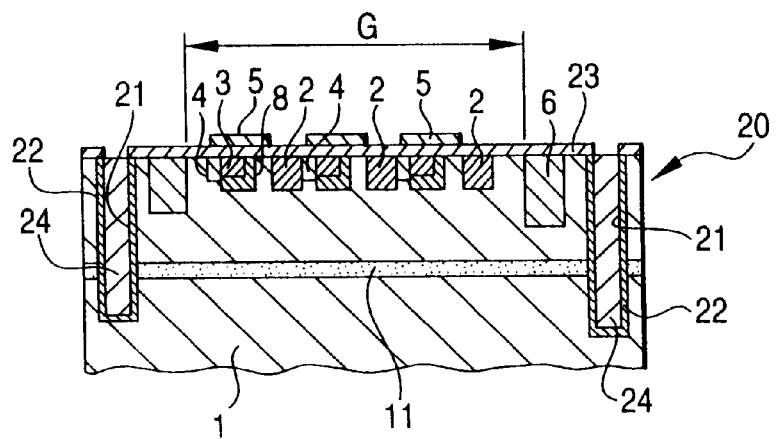
FIG. 3 is a cross sectional view of an important part showing one embodiment of a solid image pickup device according to the second aspect of the invention.

FIG. 3 is a cross sectional view of an important part showing one embodiment of solid image pickup device according to the second aspect of the invention, in which numeral 20 denotes a solid image pickup device. The solid image pickup device 20 is different from the solid image pickup device 10 shown in FIG. 1 in the following points. A trench 21 is formed in a peripheral part of the silicon substrate 1 to surround the pixel region G and to separate the overflow barrier layer 11 into the pixel region G and an outer peripheral part, and an impurity diffusion layer 22 having a conductive type different from that of the overflow barrier layer 11, i.e., an N type, is formed on an inner wall of the trench 21.

An embodiment of a process for producing the solid image pickup device having such a constitution will be described below.

As similar to the first embodiment, an overflow barrier layer 11 is formed by ion implantation with a high implantation energy without using a resist mask.

Figure 4A:
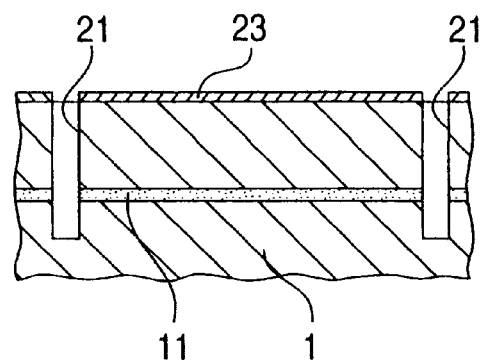
FIGS. 4A to 4C are cross sectional views and a plan view of an important part showing one embodiment of the process for producing a solid image pickup device according to the third aspect of the invention.

As shown in FIG. 4A, a silicon oxide film 23 is formed on the surface of the silicon substrate 1, for example, by a heat oxidation method. A trench 21 is formed by engraving the peripheral part of the silicon substrate 1 beyond the overflow barrier layer 11 to surround the pixel region G by anisotropic etching by a known lithography method and RIE (reactive ion etching). That is, as shown in the plan view of FIG. 4B, the trench 21 is formed in the overflow barrier layer 11 (shown by the hatched area in FIG. 4B) formed on the entire silicon substrate 1 to surround the pixel region G, so as to separate the overflow barrier layer 11 into the pixel region G and the outer peripheral part.

Upon forming the trench 21, it is possible that the trench 21 is partially formed intermittently but not continuously surrounding the pixel region G completely if the overflow barrier layer 11 is sufficiently electrically separated into the pixel region G and the outer peripheral part by an impurity diffusion layer 22 described later.

Figure 4B:
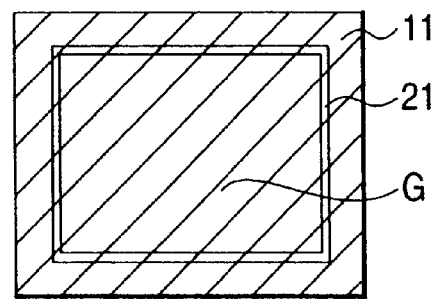
Figure 4C:
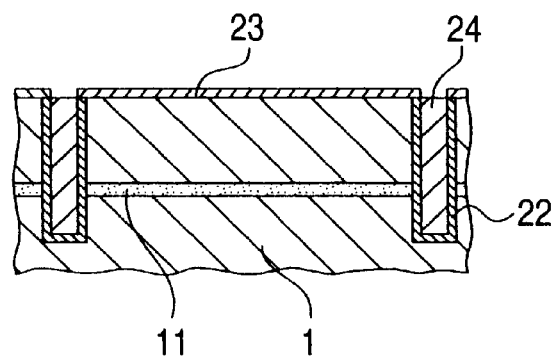

Polysilicon added with phosphor (P) is then accumulated on the silicon substrate 1 by a reduced pressure CVD method to fill the polysilicon into the trench 21. The polysilicon accumulated onto the silicon substrate 1 is then removed by an etch-back method to leave the polysilicon buried only in the trench 21, so as to form a plug 24 as shown in FIG. 4C.

Thereafter, a heat treatment is conducted to subject phosphor (P) to solid diffusion from the plug 24 made of the polysilicon in the trench 21, so as to form an impurity diffusion layer 22 on the inner wall of the trench 21.

Other constitutional components of the solid image pickup device 20 can generally be formed in the conventional manner after the formation of the overflow barrier layer 11 and the plug 24, as similar to the case of the solid image pickup device 10. The heat treatment for forming the impurity diffusion layer 22 may be conducted as another heat treatment for forming the other constitutional components but not independently conducted immediately after the formation of the plug 24.

In the production process, because the ion implantation is conducted using no resist mask as similar to the case shown in FIG. 1, the ion implantation can be conducted with a high implantation energy, and thus the overflow barrier layer 11 can be formed at a deep position to obtain a wide photoelectric conversion region. Furthermore, owing to the ion implantation conducted without a resist mask, generation of radiation can be surely prevented even when the ion implantation is conducted at a super high energy of from 6 to 7 MeV, which causes a problem of generation of radiation with using a resist mask.

Moreover, because the impurity diffusion layer 22 is formed on the inner wall of the trench 21, an interface processing is, as a result, conducted between the overflow barrier layer 11 and the plug 24, whereby the junction withstanding voltage to the impurity diffusion layer 22 can be improved, and the leakage electric current can be effectively decreased as described later.

The solid image pickup device 20 produced in the manner described in the foregoing is generally formed by cutting a silicon wafer having the pixel part and various wiring formed therein at a scribe line thereof into respective chips.

Therefore, the overflow barrier layer 11 is exposed on the side surface of the silicon substrate 1, as similar to the solid image pickup device 10 shown in FIG. 1. Because the overflow barrier layer 11 is electrically separated into the pixel region G and the outer peripheral part by the trench 21, the plug 24 and the impurity diffusion layer 22, the leakage electric current, which causes a problem in the solid image pickup device 10, is not generated in the solid image pickup device 20 of this embodiment, and thus the measure for preventing the leakage electric current outside the package is not necessary.

Figure 5:
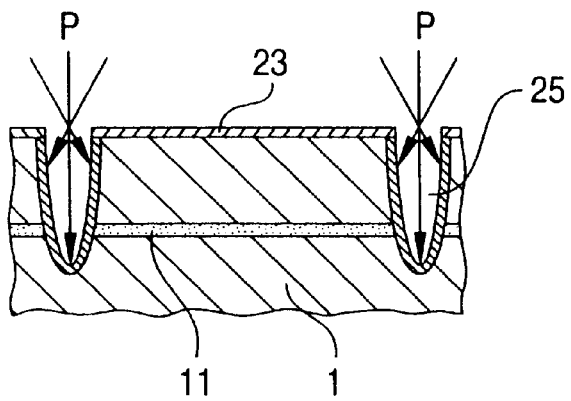
FIG. 5 is a cross sectional view of an important part showing a modified embodiment of the process for producing a solid image pickup device shown in FIGS. 4A to 4C.

In the embodiment shown in FIGS. 3 and 4A to 4C, the trench 21 is formed by anisotropic etching, but the invention is not limited to the embodiment, and as shown in FIG. 5, a trench 25 may be formed by isotropic etching by a wet etching process.

When the trench 25 is formed by isotropic etching, the trench 25 has a larger opening area on the side of the surface of the silicon substrate 1 than the trench 21 formed by anisotropic etching. In this case, therefore, an impurity diffusion layer 26 is formed by slanted ion implantation of phosphor (P), instead of the formation of the plug 24 and the solid phase diffusion for forming the impurity diffusion layer 22 as in the prior embodiment. In this embodiment, a plug (not shown in the figure) may be formed by burying polysilicon containing phosphor in the trench 25 as similar to the prior embodiment, and alternatively such a plug may not be formed.

In the process of forming the trench 25 by isotropic etching, the depth of the trench can be easily ensured in comparison to the case where the trench is formed by anisotropic etching, whereby the processing step for forming the trench can be simplified, and in some cases, a step of forming the plug can be omitted.

Figure 6A:
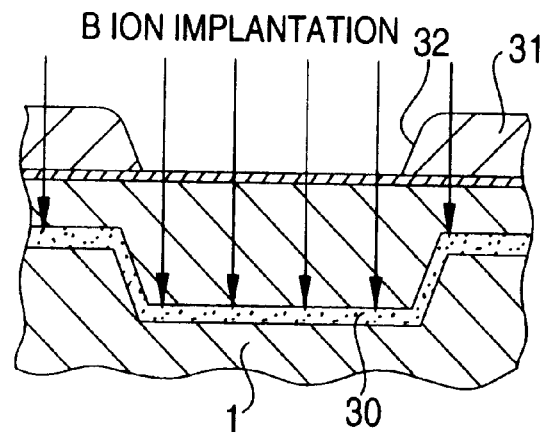
FIGS. 6A and 6B are cross sectional views of an important part showing another embodiment of the process for producing a solid image pickup device according to the third aspect of the invention.
Figure 6B:
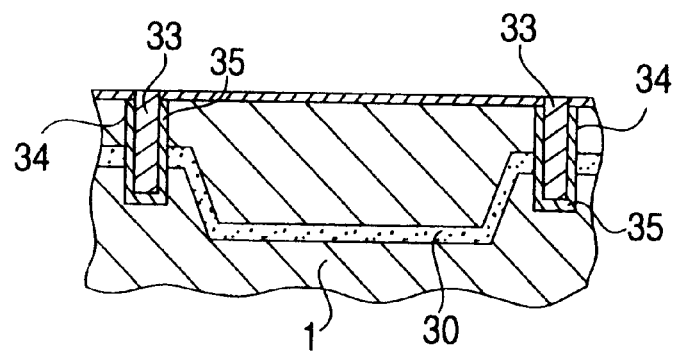

FIGS. 6A and 6B are cross sectional views of an important part showing another embodiment of the process for producing a solid image pickup device according to the third aspect of the invention. This embodiment is different from the production process shown in FIGS. 4A to 4C in the point in that an overflow barrier layer 30 is formed by using a resist mask 31.

In this embodiment, a resist mask 31 having an opening 32 at a position corresponding to the pixel region G is formed on the silicon substrate 1 as shown in FIG. 6A. The resist mask 31 is formed in such a manner that it has a thickness that is sufficiently smaller than the projection range (Rp) set in the subsequent ion implantation step, whereby an implanted ion is not stopped in the resist mask 31 but reaches the interior of the silicon substrate 1 through the resist mask 31.

Upon forming the opening 32, the inner wall thereof is formed to have a taper shape, in which the size of the opening 32 is gradually decreased from the upper side to the lower side. The taper shape can be ordinarily formed by reduction of the resist in the normal pattern formation. For example, after conducting an exposure and development process for forming the resist mask 31, a post baking treatment is conducted at about 150° C. for about from several tens seconds to 1 minute, so as to obtain the opening 32 having an inner wall with the taper shape.

By using the resist mask 31 having the opening 32, ion implantation is conducted for the entire silicon substrate 1 with such a high implantation energy that penetrates the resist mask 31 to form the overflow barrier layer 30. For example, in the case where the depth of the overflow barrier layer 30 is set at 5 µm outside the pixel region G, the resist is coated to a thickness of from 4 to 5 µm to have elemental power of 3 µm as silicon, and then the opening 32 is formed.

In the case where the ion implantation is conducted by using the resist mask 31, under the resist mask 31, an impurity profile, i.e., the overflow barrier layer 30, having a projection range (Rp) at a position relatively shallower from the surface of the silicon substrate 1 is formed, and under the opening 32, the overflow barrier layer 30 is formed at a relatively deeper position corresponding to the prescribed projection range (Rp). Since the inner wall of the opening 32 has a taper shape, the overflow barrier layer 30 is also formed to be slanted but not parallel to the silicon substrate 1 at the position corresponding to the taper shape of the opening 32. Therefore, the resulting overflow barrier layer 30 is formed at a deep position at the region corresponding to the pixel region G and is formed at a shallow position at the region corresponding to the outer peripheral part of the pixel region G, where it is formed to connect the deep position and the shallow position therebetween.

Subsequently, as similar to the case of FIGS. 4A to 4C, a trench 33 is formed by anisotropic etching, and a plug 34 made of polysilicon containing phosphor (P) is then formed, as shown in FIG. 6B. Thereafter, solid phase diffusion is conducted by a heat treatment to form an impurity diffusion layer 35 on the inner wall of the trench 33.

In this embodiment of the production process, because the ion implantation is conducted without the resist mask 31 at the pixel region G corresponding to the opening 32, the overflow barrier layer 30 can be formed at a deep position by conducting the ion implantation at a high implantation energy to obtain a wide photoelectric conversion region.

Furthermore, because the resist mask 31 is formed to have a small thickness through which the ion passes upon ion implantation, the problems caused by forming a thick resist mask can be avoided.

Moreover, because the overflow barrier layer 30 is formed at a relatively shallow position outside the pixel region G, the formation of the trench 33 can be easily conducted, and thus it can be easily conducted by anisotropic etching.

As similar to the case shown by FIGS. 3 and 4A to 4C, because the overflow barrier layer 30 is electrically separated into the pixel region G and the outer peripheral part by the trench 33, the plug 34 and the impurity diffusion layer 35, generation of the leakage electric current, which causes a problem in the solid image pickup device 10, is prevented, and thus the measure for preventing the leakage electric current outside the package is not necessary.

Although the ion implantation is conducted with the use of the resist mask 31 in this embodiment, generation of radiation can be prevented because the ion implantation is conducted at such a high implantation energy that the ion is not stopped in the resist mask 31 but passes through the same.

As described in the foregoing, in the process for producing a solid image pickup device according to the first aspect of the invention, ion implantation is conducted for the entire silicon substrate without using a resist mask, and thus the overflow barrier layer can be formed at a deep position by conducting the ion implantation at a high implantation energy to ensure a wide photoelectric conversion region, so as to improve the sensitivity. Furthermore, even when the ion implantation is conducted at a super high energy causing a problem of generation of radiation, generation of radiation can be surely prevented since the ion implantation is conducted without using a resist mask.

In the solid image pickup device according to the second aspect of the invention, the trench is formed in the peripheral part of the silicon substrate to surround the pixel region and to separate the overflow barrier layer into the pixel region and the outer peripheral part, and the impurity diffusion layer having a conductive type different from that of the overflow barrier layer is formed on the inner wall of the trench. Thus, generation of the leakage electric current at the junction of the silicon substrate and the overflow barrier layer exposed on the side surface of the silicon substrate can be prevented by electrically separating the overflow barrier layer into the pixel region and the outer peripheral part by the impurity diffusion layer.

In the process for producing a solid image pickup device according to the third aspect of the invention, the trench is formed in the peripheral part of the silicon substrate to surround the pixel region and to separate the overflow barrier layer into the pixel region and the outer peripheral part, and the impurity diffusion layer having a conductive type different from that of the overflow barrier layer is formed on the inner wall of the trench. Thus, the overflow barrier layer can be electrically separated into the pixel region and the outer peripheral part by the impurity diffusion layer, and therefore generation of the leakage electric current at the junction of the silicon substrate and the overflow barrier layer exposed on the side surface of the silicon substrate can be prevented.

Furthermore, when the overflow layer is formed by conducting ion implantation using no resist mask, the problem caused by conducting ion implantation at a high energy is removed, and the overflow barrier layer can be formed at a deep position, whereby a wide photoelectric conversion region is ensured to improve the sensitivity. Moreover, owing to the ion implantation conducted without a resist mask, generation of radiation can be surely prevented even when the ion implantation is conducted at a super high energy, which causes a problem of generation of radiation.

What is claimed is:
1. A process for producing a solid image pickup device having a vertical overflow drain structure, said process comprising:
a step of conducting ion implantation for an entire extent of a silicon substrate without using a resist mask to form an overflow barrier layer.

2. A process for producing a solid image pickup device as claimed in claim 1, wherein said step of ion implantation forms the overflow barrier layer at a depth of about 10 micrometers from a surface of the silicon substrate.

3. A process for producing a solid image pickup device as claimed in claim 1 wherein the step of conducting ion implantation occurs at about a range of from 6 to 7 Mev.

4. A process for producing a solid image pickup device as claimed in claim 1 wherein said step of ion implantion includes a step of ion-implanting boron at a high implantation energy directly to a surface of the silicon substrate.

5. A solid image pickup device having a vertical overflow drain structure, said device comprising:
   an overflow barrier layer formed over an entire extent of a silicon substrate,
   a trench formed in a peripheral part of said silicon substrate to surround a pixel region and to separate said overflow barrier layer into said pixel region and an outer peripheral part, and
   an impurity diffusion layer having a conductive type different from that of said overflow barrier layer formed on an inner wall of said trench.

6. A solid image pickup device as claimed in claim 5 wherein said trench reaches at least to the overflow drain.

7. A process for producing a solid image pickup device having a vertical overflow drain structure, said process comprising:
   a step of conducting ion implantation on an entire extent of a silicon substrate to form an overflow barrier layer,
   a step of forming a trench in a peripheral part of said silicon substrate to surround a pixel region and to separate said overflow barrier layer into said pixel region and an outer peripheral part, and
   a step of forming an impurity diffusion layer having a conductive type different from that of said overflow barrier layer on an inner wall of said trench.

8. A process for producing a solid image pickup device as claimed in claim 7, wherein said step of forming said trench is further characterized in that said trench is formed by anisotropic etching, said step of forming an impurity region is further includes a step of burying polysilicon containing an impurity in said trench, and then diffusing said impurity to said inner wall of said trench by conducting a heat treatment, so as to form said impurity diffusion layer.

9. A process for producing a solid image pickup device as claimed in claim 7, wherein said step of forming said trench is further characterized in that said trench is formed by isotropic etching, and said step of forming an impurity diffusion layer is further characterized in that said impurity diffusion layer is formed by ion implantation of an impurity.

10. A process for producing a solid image pickup device as claimed in claim 7, wherein said step of conducting is further characterized in that said overflow barrier layer is formed by ion implantation without using a resist mask.

11. A process for producing a solid image pickup device as claimed in claim 7, wherein said step of conducting is further characterized in that said overflow barrier layer is formed by using a resist mask having an opening at a position corresponding to said pixel region, and by conducting ion implantation on an entire extent of said silicon substrate at such an ion implantation energy that penetrates said resist mask.

12. A process for producing a solid image pickup device as claimed in claim wherein said step of forming said trench is further characterized in that said trench reaches at least to the overflow drain.

13. A process for producing a solid image pickup device having a vertical overflow drain structure, said process comprising a step of conducting ion implantation for including a scribe region to form an overflow barrier layer.

* * * * *

UNITED STATES PATENT AND TRADEMARK OFFICE
CERTIFICATE OF CORRECTION

PATENT NO. : 6,436,729 B1 Page 1 of 1
DATED : August 20, 2002
INVENTOR(S) : Hideshi Abe It is certified that error appears in the above-identified patent and that said Letters Patent is hereby corrected as shown below:

Column 10,
Line 29, replace "claim wherein" with -- claim 3 wherein --.

Signed and Sealed this

Fourteenth Day of October, 2003

JAMES E. ROGAN
*Director of the United States Patent and Trademark Office*